(12) United States Patent
Shin et al.

(10) Patent No.: US 6,635,536 B2
(45) Date of Patent: Oct. 21, 2003

(54) METHOD FOR MANUFACTURING SEMICONDUCTOR MEMORY DEVICE

(75) Inventors: Hwa-sook Shin, Suwon (KR); Duk-min Yi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 252 days.

(21) Appl. No.: 09/925,914

(22) Filed: Aug. 9, 2001

(65) Prior Publication Data

US 2002/0037611 A1 Mar. 28, 2002

(30) Foreign Application Priority Data

Sep. 27, 2000 (KR) ............................................. 00-56716

(51) Int. Cl.[7] ......................................... H01L 21/8236
(52) U.S. Cl. ....................... 438/276; 438/290; 438/289; 438/291; 438/276; 438/277; 438/278; 438/279; 438/672; 438/675

(58) Field of Search ................................. 438/290, 289, 438/291, 276, 277, 278, 279, 672, 675

Primary Examiner—Long Pham
(74) Attorney, Agent, or Firm—Mills & Onello LLP

(57) ABSTRACT

A method for manufacturing a semiconductor memory device is disclosed. A spacer of a material having a high etching selection ratio with respect to an interdielectric layer is formed on a sidewall of a gate electrode. A refractory metal silicide layer is formed on an upper surface of the gate electrode and on an upper surface of a substrate on which source and drain regions are formed, thereby providing a contact hole self-aligned between the gate electrodes. Also, an ion implantation process is performed on the entire active region after the contact hole is filled with metal such as tungsten, and an impurity region is formed only on a lower portion of the gate electrode.

7 Claims, 4 Drawing Sheets

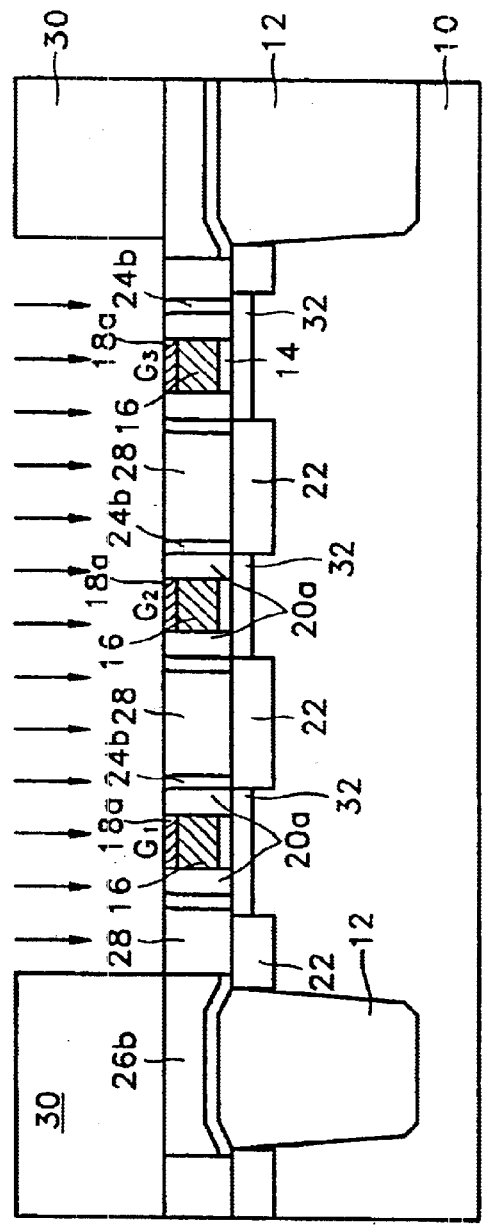
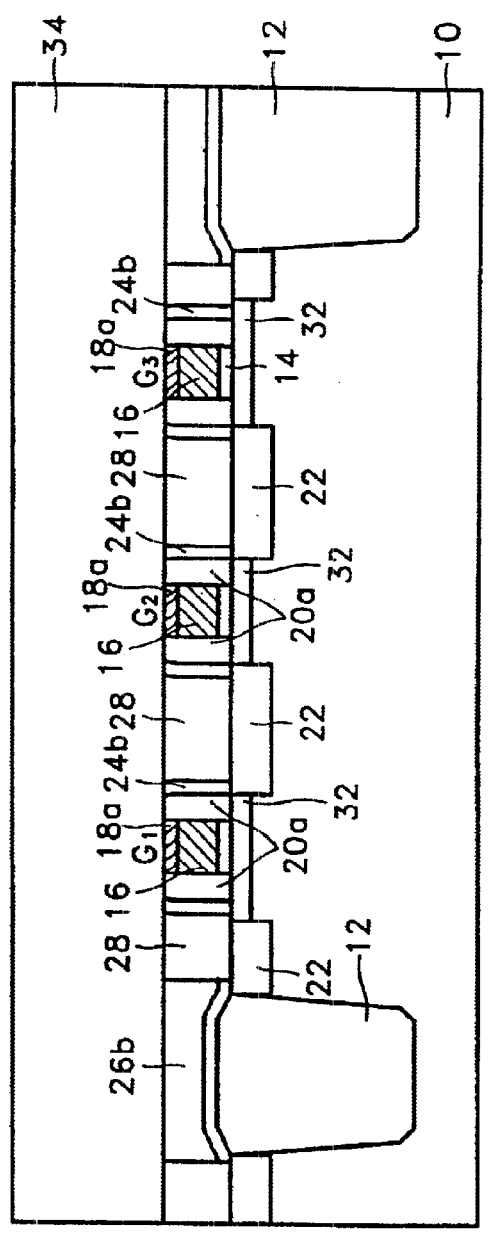
FIG. 5
FIG. 6

METHOD FOR MANUFACTURING SEMICONDUCTOR MEMORY DEVICE

BACKGROUND OF THE INVENTION

1. Field of the Invention

The present invention relates to a method for manufacturing a semiconductor memory device, and more particularly, to a method for manufacturing a semiconductor memory device in which a contact hole for exposing an active region of a semiconductor substrate is self-aligned and ions are locally implanted only on a channel region.

2. Description of the Related Art

As semiconductor memory devices become more highly integrated, the size of a unit cell becomes smaller. In particular, as the size of a cell transistor becomes smaller, short-channel effects such as lowering of threshold voltage and increase in leakage current cause dynamic refresh of a dynamic random access memory (DRAM) to be deteriorated. In order to solve this problem, there is a method for increasing a threshold voltage in which N-type (or P-type) impurity ions are implanted on a substrate before forming a gate electrode in a N-channel transistor (or P-channel transistor), and the concentration of impurities on the substrate is increased.

Also, in order to form P-type (or N-type) source and drain regions on a channel region of the N-channel transistor (or P-channel transistor), the concentration of impurities on the source and drain regions must be larger than the concentration of impurities on the channel region. However, when the size of the transistor becomes smaller, the concentration of ion implantation impurities for suppressing change in the threshold voltage due to the short-channel effect must be increased. Thus, a difference in the concentration of impurities between the source and drain regions of the transistor and the channel region of the transistor is reduced by an increase in integration. Accordingly, junction capacitance between the source and drain regions and the channel region is increased, and the operation speed of the transistor is reduced.

Further, since the concentration of impurity ions for controlling the threshold voltage of the substrate (or well formed on the substrate) is increased by the increase in integration, the junction capacitance is increased by the increase in integration, and a leakage current flowing into the substrate (or well) from the source and drain regions is increased.

A local implantation technology for locally forming an impurity region only on a lower portion of the channel region of the transistor has been developed in solving these problems. However, as the semiconductor memory devices become more highly integrated, it becomes more difficult to manufacture a mask for covering only a portion where a gate electrode is formed. Also, it becomes difficult to obtain a process margin for misalignment in forming a contact hole for use in a plug connecting an active region on the substrate to a bit line, a capacitor or a metal wiring which are formed later.

SUMMARY OF THE INVENTION

To solve the above problems, it is an object of the present invention to provide a method for forming a contact hole of a semiconductor memory device capable of obtaining a process margin for misalignment.

It is another object of the present invention to provide a method for forming an impurity region only on a lower portion of a gate electrode of the semiconductor memory device, that is, only on a channel region of the semiconductor memory device.

In accordance with the invention, there is provided a method for manufacturing a semiconductor memory device. A semiconductor substrate comprising an active region and an inactive region is provided. A transistor is formed in the substrate. The transistor has a gate electrode structure including a gate electrode formed of a polysilicon pattern, a spacer formed on a sidewall of the gate electrode, and a source and drain regions in the active region. A refractory metal silicide layer pattern is formed on an upper surface of the polysilicon layer pattern, and a refractory metal silicide layer is formed on an upper surface of the semiconductor substrate on the source and drain regions. An interdielectric layer of a material having a high etching selection ratio with respect to a material forming the spacer, is formed on the entire surface of the semiconductor substrate on which the refractory metal suicide layer pattern and the refractory metal suicide layer are formed. A mask for exposing the active region is formed on the interdielectric layer. An etching process using the mask is performed to form a contact hole for exposing the upper surface of the refractory metal silicide layer pattern and the refractory metal silicide layer. The contact hole is filled with metal to form a contact plug.

In one embodiment, an etch stop layer is formed on the entire surface of the semiconductor substrate after forming the refractory metal silicide layer pattern and the refractory metal silicide layer and before forming the interdielectric layer.

The refractory metal can include Co or Ti, and the refractory metal silicide layer pattern and the refractory metal silicide layer can include $CoSi_x$ or $TiSi_x$. The spacer can be formed of silicon nitride film, aluminum oxide film, or tantalum oxide film, and the interdielectric layer can be formed of a material different from the spacer and can be a silicon oxide film, a silicon nitride film, an undoped silicate glass (USG) film, a phosphosilicate glass (PSG) film, a borosilicate glass (BSG) film, a borophosphosilicate galss (BPSG) film, a tetraethylorthosilicate glass (TEOS) film, an ozone-TEOS film, a plasma enhanced (PE)-TEOS film, or a combination film of these films. The etch stop layer can be a silicon oxynitride film.

In one embodiment, the method can also include implanting ions having the same conductivity type as that of the semiconductor substrate on the active region and forming an impurity region on the semiconductor substrate arranged on a lower portion of the gate electrode structure, after forming the contact plug. The contact plug can be formed of W, Al, or Cu, or a combination film of W, Al, and Cu.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 1 through 7 are schematic sectional views of a semiconductor memory device illustrating a method for forming a self-aligned contact hole and a channel, according to an embodiment of the present invention.

DETAILED DESCRIPTION OF PREFERRED EMBODIMENTS OF THE INVENTION

Figure 1:
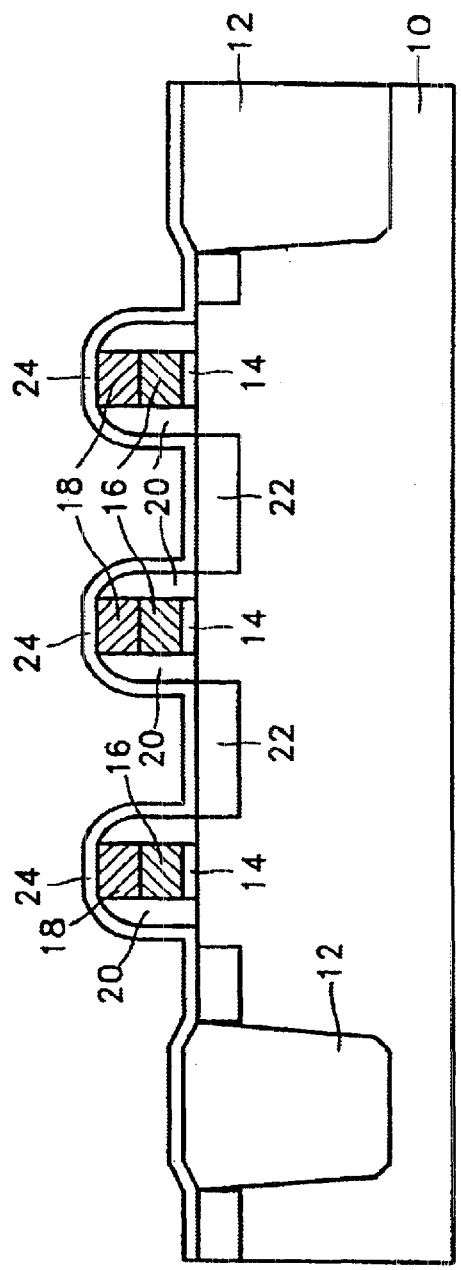

Referring to FIG. 1, a semiconductor substrate 10 is divided into an active region and an inactive region by a device isolation layer 12. The device isolation layer 12 is formed by shallow trench isolation (STI) or local oxidation of silicon (LOCOS), and preferably, STI is used in a highly integrated semiconductor memory device.

An insulating layer (not shown) and a polysilicon layer (not shown) are sequentially formed on the entire surface of the semiconductor substrate 10 on which the device isolation layer 12 is formed, and the insulating layer and the polysilicon layer are patterned, thereby forming a gate oxide layer 14 and a polysilicon layer pattern 16. Next, a spacer 20 is formed on a sidewall of the polysilicon layer pattern 16. Preferably, the spacer 20 is formed of a material having a high etching selection ration with respect to an interdielectric layer (26 of FIG. 2) to be later formed. In one embodiment, the spacer 20 is formed of silicon nitride film.

After forming the spacer 20, impurity ions having a conductivity type opposite to a conductivity type of the substrate 10 are implanted on the entire surface of the semiconductor substrate 10, thereby forming source and drain regions (not shown). Subsequently, a refractory metal layer is formed and heat-treated on the entire surface of the semiconductor substrate 10, thereby forming a refractory metal silicide layer. The refractory metal silicide layer is formed on the substrate 10 contacting an upper portion of the polysilicon layer pattern 16 and the source and drain regions, thereby forming a refractory metal silicide layer pattern 18 and a silicide region 22. In one embodiment, the refractory metal is Co or Ti, and the refractory metal silicide is $CoSi_x$ or $TiSi_x$. In the resulting structure, a gate electrode includes the polysilicon layer pattern 16 and the refractory metal silicide layer pattern 18, and a gate electrode structure refers to the spacer 20 in addition to the polysilicon layer pattern 16 and the refractory metal suicide layer pattern 18. The refractory metal not being silicified is removed. Next, silicon oxynitride film 24 is formed as an etch stop layer on the entire surface of a resultant structure in which the gate electrode structure is formed.

Figure 2:
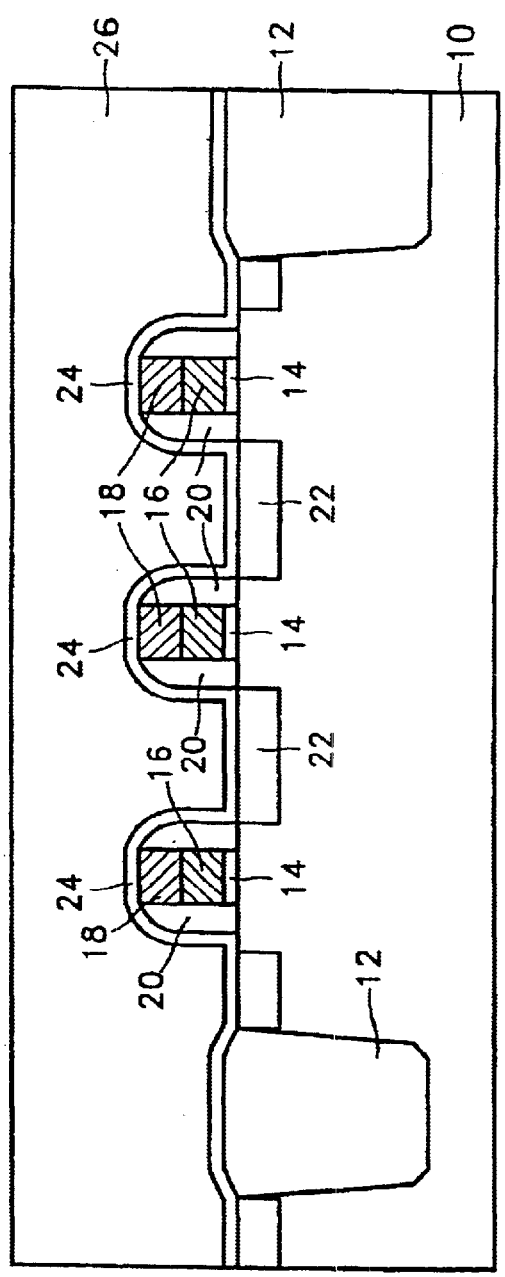

Referring to FIG. 2, a planarized first interdielectric layer 26 is formed on the etch stop layer 24. The first interdielectric layer 26 is formed of a material different from the etch stop layer 24, that is, for example, silicon oxide film, silicon nitride film, phosphosilicate glass (PSG) film, borosilicate glass (BSG) film, borophosphosilicate galss (BPSG) film, tetraethylorthosilicate glass (TEOS) film, ozone-TEOS film, or plasma enhanced (PE)-TEOS film, undoped silicate glass (USG) film or a selective combination film of the films.

Figure 3:
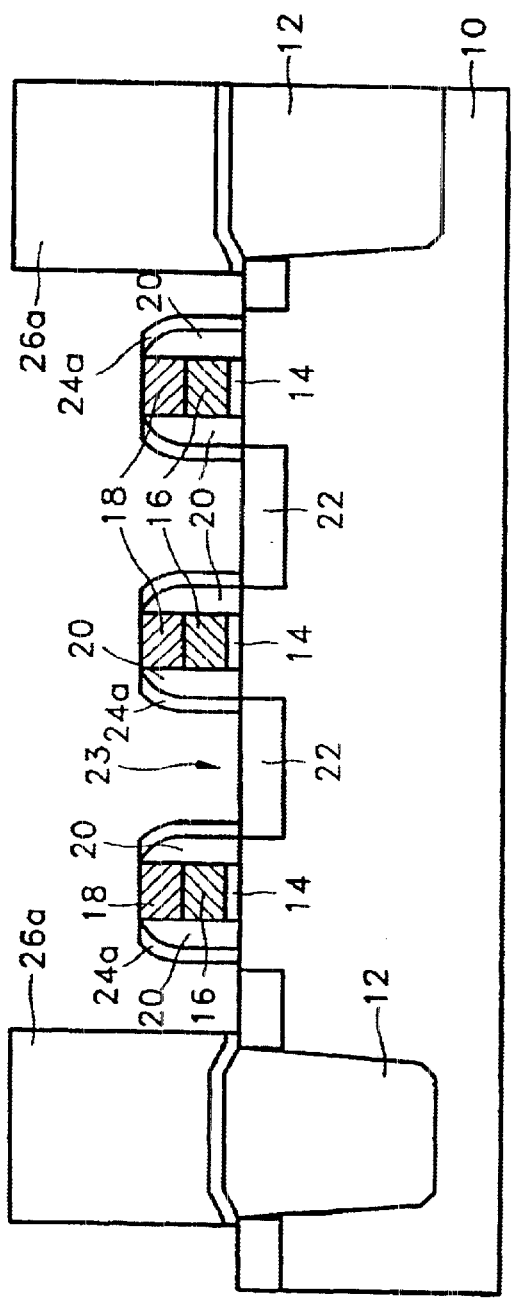

A photoresist mask pattern (not shown) for opening the active region is formed on the first interdielectric layer 26, and then an etching process is performed. The first interdielectric layer 26 formed on the active region by the etching process is removed as shown in FIG. 3. That is, the silicon oxynitride film on the silicide region 22 and on the upper portion of the refractory metal silicide layer pattern 18 is removed, and the refractory silicide region 22 is exposed by a self-aligned contact hole 23. The numeral 24*a* indicates the oxynitride film just after the above mentioned etching process. However, although there is no etch stop layer 24 in the self-aligned contact hole 23, the refractory metal silicide layer pattern 18 is formed on the upper portion of the gate electrode, and the first interdielectric layer 26 is self-aligned and etched by the spacer 20. Thus, the contact hole 23 for exposing the silicide region 22 can be self-aligned.

Figure 4:
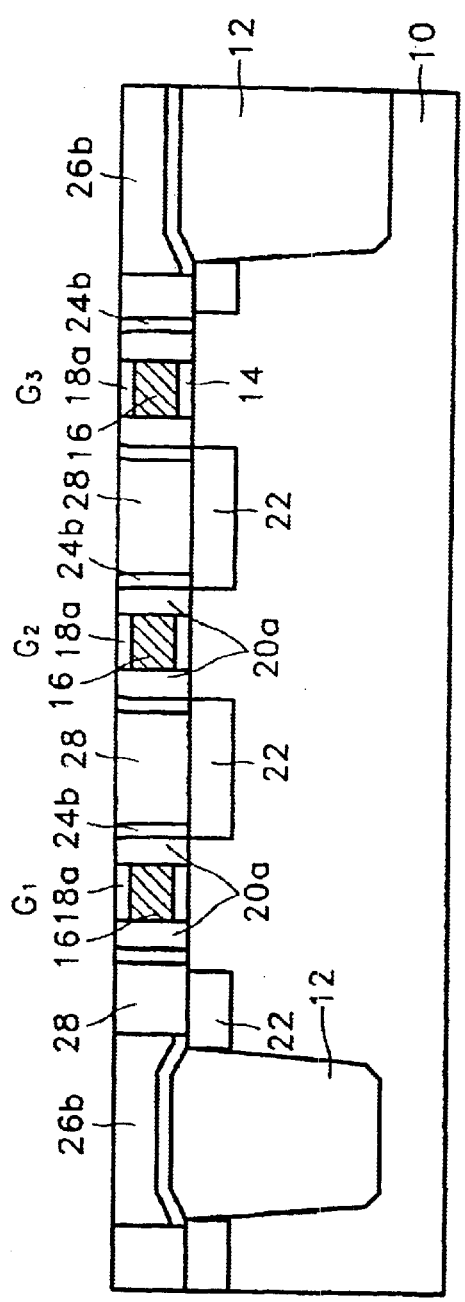

Referring to FIG. 4, a metal layer such as tungsten is formed on the entire surface of the resultant structure to fill the contact hole 23, and chemical-mechanical polishing (CMP) is performed. During polishing, part of the upper surface of the refractory metal silicide layer pattern 18, part of the spacer 20, and part of the etch stop layer 24*a* are polished, and first through third gate electrode final structures G1, G2, and G3 including a refractory metal silicide layer pattern 18*a* and a spacer 20*a* are formed. Al or Cu instead of tungsten can be used as a material for filling the contact hole 23. An etch stop layer 24*b* of which a portion is polished is formed on both sidewalls of the gate electrode final structures G1, G2, and G3. A self-aligned contact plug 28 filled with tungsten is formed between the etch stop layers 24*b* formed on a right sidewall of the first gate electrode final structure G1 and the etch stop layer 24*b* formed on a left sidewall of the second gate electrode final structure G2, and between the etch stop layer 24*b* formed on a right sidewall of the second gate electrode final structure G2 and the etch stop layer 24*b* formed on a left sidewall of the third gate electrode final structure G3.

Referring to FIG. 5, a photoresist mask 30 for exposing an active region is formed on the semiconductor substrate 10 including the contact plug 28. Impurity ions having the same conductivity type as that of the substrate 10 are implanted on the substrate 10. Here, since the implanted ions cannot pass the tungsten plug 28, an impurity region 32 is not formed on the silicide region 22. The impurity region 32 is formed only on lower portions of the gate electrode final structures G1, G2, and G3. Consequently, the ion implantation region 32 is locally formed only on a channel region.

Referring to FIG. 6, after forming the impurity region 32, a planarized second interdielectric layer 34 is formed on the entire surface of the semiconductor substrate 10.

Figure 7:
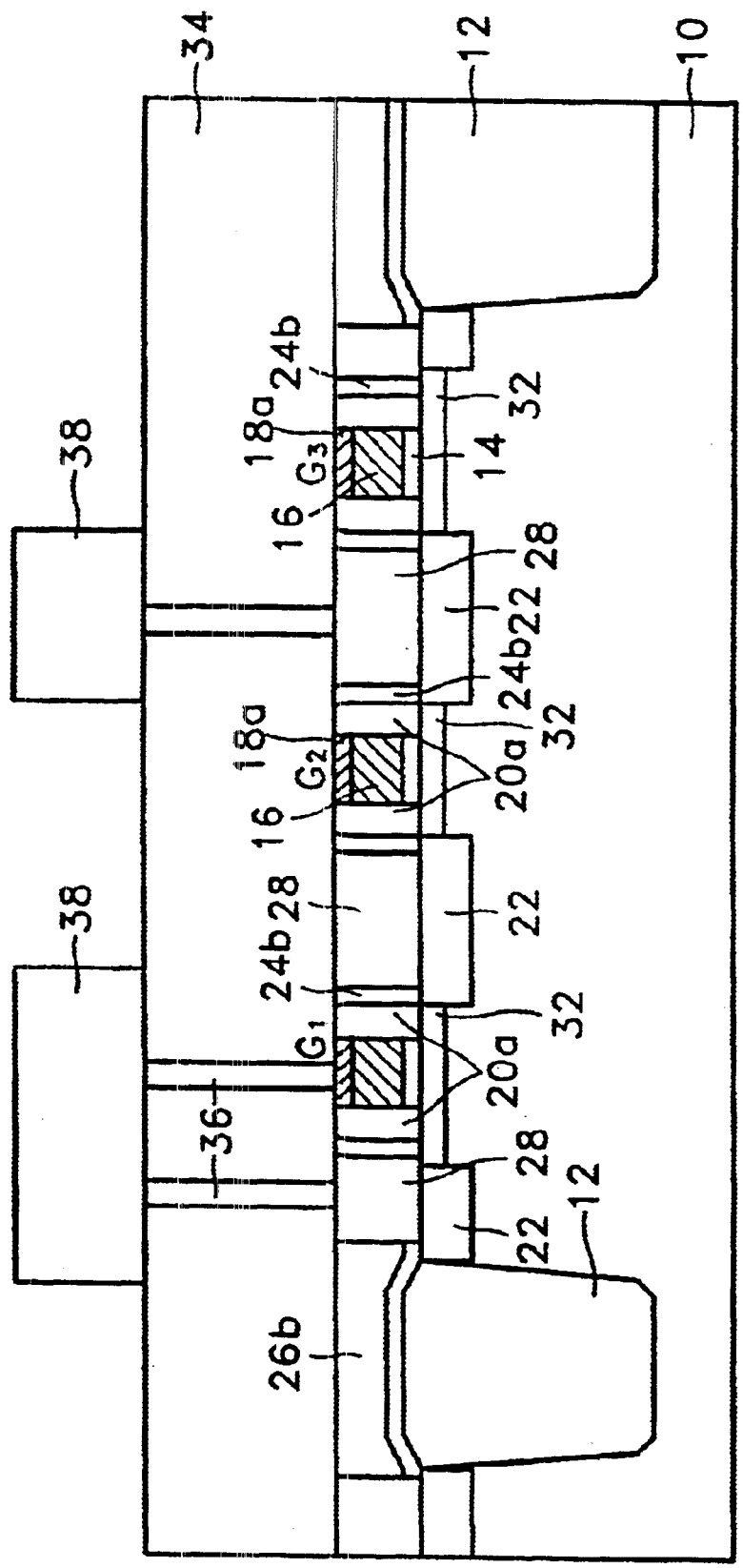

Next, in FIG. 7, a predetermined portion of the second interdielectric layer 34 is etched, and the contact hole for exposing the upper portion of the tungsten plug 28 or the upper portion of the gate electrode final structure is formed, and the contact hole is filled with metal, thereby forming a metal contact plug 36. The metal contact plug 36 can be formed of metal such as W, Al or Cu, or combination metal of Al and Cu and W. Subsequently, a metal layer is formed and patterned on the second interdielectric layer 34 on which the metal contact plug 36 is formed, thereby forming an interconnection layer 38.

According to the present invention, a spacer formed of a material having a high etching selection ratio with respect to an interdielectric layer is formed on a sidewall of a gate electrode, and a refractory metal silicide layer is formed on an upper surface of the gate electrode and on an upper surface of a substrate on which source and drain regions are formed, thereby self-aligning a contact hole between the gate electrodes. Thus, a margin for misalignment in a manufacturing process of high-integration memory devices can be obtained when a contact hole is formed on an active region of a semiconductor substrate.

Also, an ion implantation process is performed on the entire active region after the contact hole is filled with metal such as tungsten, and an impurity region is formed only on a lower portion of the gate electrode. Thus, junction capacitance and a leakage current in a highly integrated semiconductor device can be reduced.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method for manufacturing a semiconductor a semiconductor memory device comprising:

preparing a semiconductor substrate comprising an active region and an inactive region;

forming a transistor in the substrate, the transistor having a gate electrode structure including a gate electrode formed of a polysilicon pattern, a spacer formed on a sidewall of the gate electrode, and source and drain regions in the active region;

forming a refractory metal silicide layer pattern on an upper surface of the polysilicon layer pattern and a refractory metal silicide layer on an upper surface of the semiconductor substrate on the source and drain regions;

forming an interdielectric layer formed of a material having a high etching selection ratio with respect to a material forming the spacer, on the entire surface of the semiconductor substrate on which the refractory metal silicide layer pattern and the refractory metal silicide layer are formed;

forming a mask for exposing the active region on the interdielectric layer;

performing an etching process using the mask to form a contact hole for exposing the upper surface of the refractory metal silicide layer pattern and the refractory metal silicide layer; and filling the contact hole with metal to form a contact plug.

2. The method according to claim 1, wherein the refractory metal comprises at least one of Co and Ti, and the refractory metal silicide layer pattern and the refractory metal silicide layer comprise at least one of $CoSi_x$ and $TiSi_x$.

3. The method according to claim 1, further comprising forming an etch stop layer on the entire surface of the semiconductor substrate after forming the refractory metal silicide layer pattern and the refractory metal silicide layer and before forming the interdielectric layer.

4. The method according to claim 3, wherein the etch stop layer comprises a silicon oxynitride film.

5. The method according to claim 1, wherein:

the spacer is formed of at least one of a silicon nitride film, an aluminum oxide film, and a tantalum oxide film; and the interdielectric layer is formed of a material different from the material of the spacer, the material of the interdielectric layer being selected from among a silicon oxide film, a silicon nitride film, an undoped silicate glass (USG) film, a phosphosilicate glass (PSG) film, a borosilicate glass (BSG) film, a borophosphosilicate galss (BPSG) film, a tetraethylorthosilicate glass (TEOS) film, an ozone-TEOS film, a plasma enhanced (PE)-TEOS film, and a combination of one or more of a silicon oxide film, a silicon nitride film, an undoped silicate glass (USG) film, a phosphosilicate glass (PSG) film, a borosilicate glass (BSG) film, a borophosphosilicate galss (BPSG) film, a tetraethylorthosilicate glass (TEOS) film, an ozone-TEOS film, and a plasma enhanced (PE)-TEOS film.

6. The method according to claim 1, further comprising, after forming the contact plug, implanting ions having the same conductivity type as that of the semiconductor substrate on the active region and forming an impurity region on the semiconductor substrate arranged on a lower portion of the gate electrode structure.

7. The method according to claim 1, wherein the contact plug is formed of at least one of W, Al, Cu, and a combination film of one or more of W, Al, and Cu.

* * * * *

UNITED STATES PATENT AND TRADEMARK OFFICE
CERTIFICATE OF CORRECTION

PATENT NO.    : 6,635,536 B2
DATED         : October 21, 2003
INVENTOR(S)   : Hwa-sook Shin et al.

It is certified that error appears in the above-identified patent and that said Letters Patent is hereby corrected as shown below:

Column 4,
Line 66, please delete the second occurrence of "a semiconductor".
Line 14, please change "galss" to -- glass --.

Column 6,
Line 20, please change "galss" to -- glass --.

Signed and Sealed this

Sixteenth Day of March, 2004

JON W. DUDAS
*Acting Director of the United States Patent and Trademark Office*